(12) United States Patent
Kawahira et al.

(10) Patent No.: US 9,529,050 B2
(45) Date of Patent: Dec. 27, 2016

(54) DIAGNOSTIC DEVICE FOR DEGRADATION OF RECHARGEABLE LI-ION BATTERY

(71) Applicant: IMV CORPORATION, Osaka (JP)

(72) Inventors: Takao Kawahira, Osaka (JP); Yasuhiro Uchiyama, Osaka (JP); Jumpei Kojima, Osaka (JP); Toru Katsurai, Osaka (JP); Koji Kawata, Osaka (JP); Toshiyuki Kobayashi, Osaka (JP); Tatsuo Nishina, Yamagata (JP)

(73) Assignee: IMV CORPORATION, Osaka (JP)

( * ) Notice: Subject to any disclaimer, the term of this patent is extended or adjusted under 35 U.S.C. 154(b) by 630 days.

(21) Appl. No.: 13/836,085

(22) Filed: Mar. 15, 2013

(65) Prior Publication Data

US 2013/0342212 A1 Dec. 26, 2013

(30) Foreign Application Priority Data

Jun. 26, 2012 (JP) ................................. 2012-143051

(51) Int. Cl.
*H02J 7/00* (2006.01)
*H02J 7/04* (2006.01)
(Continued)

(52) U.S. Cl.
CPC ......... *G01R 31/362* (2013.01); *G01R 31/3679* (2013.01); *B60L 11/1861* (2013.01);
(Continued)

(58) Field of Classification Search
CPC .... H01M 10/48; H01M 10/44; H01M 10/441; H01M 10/465; H01M 10/482; H01M 10/4207; H01M 10/425; H01M 10/486; H01M 10/42097; H01M 10/4285; H01M 10/54; H01M 2220/30; H01M 2/1072; B60L 11/1861; B60L 11/1816; B60L 11/1857; B60L 2240/545; B60L 2240/547; B60L 2240/549; H02J 7/0021; H02J 7/0047; H02J 7/0052; H02J 7/0086; H02J 2007/005; H02J 7/007; H02J 7/0093
(Continued)

(56) References Cited

U.S. PATENT DOCUMENTS

2007/0046263 A1 3/2007 Matsushima et al.
2008/0169819 A1 7/2008 Ishii
(Continued)

FOREIGN PATENT DOCUMENTS

JP 2007-170953 7/2007
JP 2007-187533 7/2007
(Continued)

OTHER PUBLICATIONS

Notification of Reasons for Refusal (including translation) for corresponding Japanese Patent Application No. 2012-143051, issued May 7, 2014.
(Continued)

*Primary Examiner* — Alexis A Boateng
(74) *Attorney, Agent, or Firm* — Jason H. Vick; Sheridan Ross, PC

(57) ABSTRACT

A diagnostic device which can measure quickly and has simple circuit is provided. A charge/discharge circuit 2 supplies charge current to a rechargeable battery 10 and discharges the rechargeable battery 10. The charge/discharge circuit 2 also breaks charge current or discharge current of the rechargeable battery 10 in charging or discharging. A voltage measurement part 6 measures terminal voltage of the rechargeable battery 10 after breaking the charge or discharge current. Diagnostic means 8 judges whether the rechargeable battery 10 is deteriorated or not based on the measured voltages. Voltage change of deteriorated rechargeable battery 10 after breaking the charge or discharge current is more rapid than that of healthy rechargeable battery 10. The diagnostic means 8 can judge whether the rechargeable battery 10 is deteriorated or not based on such voltage change.

10 Claims, 13 Drawing Sheets

(51) Int. Cl.
  *G01R 31/36* (2006.01)
  *B60L 11/18* (2006.01)
  *H01M 10/48* (2006.01)
  *H01M 10/44* (2006.01)

(52) U.S. Cl.
  CPC ......... *G01R 31/3627* (2013.01); *H01M 10/44* (2013.01); *H01M 10/48* (2013.01)

(58) Field of Classification Search
  USPC ....... 324/426, 427, 429, 430, 433, 537, 434, 324/503, 697, 76.11; 320/134, 139, 107, 320/109, 108, 112, 117, 131, 132, 135, 320/150, 162; 702/63
  See application file for complete search history.

(56) References Cited

U.S. PATENT DOCUMENTS

| | | | |
|---|---|---|---|
| 2011/0077879 A1* | 3/2011 | Paryani | 702/63 |
| 2011/0285356 A1* | 11/2011 | Maluf et al. | 320/139 |
| 2012/0007549 A1* | 1/2012 | Murayama et al. | 320/108 |
| 2012/0116701 A1* | 5/2012 | Yuasa | 702/63 |
| 2012/0235687 A1* | 9/2012 | Abe et al. | 324/537 |
| 2013/0057291 A1* | 3/2013 | Takahashi et al. | 324/427 |
| 2013/0082716 A1* | 4/2013 | Lopez Rodriguez et al. | 324/537 |
| 2013/0088201 A1 | 4/2013 | Iwasawa et al. | |
| 2013/0169232 A1* | 7/2013 | Middleton et al. | 320/134 |
| 2013/0271148 A1* | 10/2013 | Maeda | 324/426 |
| 2014/0009164 A1* | 1/2014 | Suzuki et al. | 324/430 |
| 2014/0021959 A1* | 1/2014 | Maluf et al. | 324/430 |
| 2014/0117925 A1* | 5/2014 | Pischke et al. | 320/107 |
| 2015/0022153 A1* | 1/2015 | Bouchez et al. | 320/109 |

FOREIGN PATENT DOCUMENTS

| | | |
|---|---|---|
| KR | 10-2007-0021911 | 2/2007 |
| KR | 10-2007-0051916 | 5/2007 |
| WO | WO 2011/132311 | 10/2011 |

OTHER PUBLICATIONS

Notification of Reasons for Refusal (including translation) for corresponding Japanese Patent Application No. 2012-143051, issued Jan. 6, 2014.

Shizukuni Yata "High Performance Storage Battery—Part 1, Chapter 2, Section 2, Performance of Discharge and Charge and Evaluation Method of Safety of Battery" pp. 207-213, NTS Co., Ltd.

Official Action (including translation) for corresponding Korean Patent Application No. 10-2013-0036770, issued Feb. 28, 2014.

First Notification of Office Action (including translation) for corresponding Chinese Patent Application No. 201310122201.4, issued Jun. 3, 2015.

* cited by examiner

DIAGNOSTIC DEVICE FOR DEGRADATION OF RECHARGEABLE LI-ION BATTERY

CROSS REFERENCE TO RELATED APPLICATIONS

This application claims the benefit under 35 U.S.C. 119 (a) to Japanese Application No. JP 2012-143051 filed Jun. 26, 2012, the entire disclosure of which is incorporated herein by reference in its entirety.

TECHNICAL FIELD

The present invention relates to a diagnostic device for degradation of rechargeable LI-ion battery.

BACKGROUND ART

Rechargeable battery becomes inoperable if the buttery deteriorates due to repeatedly charge and discharge. A diagnostic method has been suggested that evaluates the degradation of rechargeable Li-ion battery.

In one diagnostic method for degradation (AC impedance method), impedance of rechargeable battery is measured by measuring voltage and current when alternating voltage or alternating current is applied on the rechargeable battery. Then, impedances are plotted on complex plane when applied frequency is varied from low frequency to high frequency (Cole-Cole plot).

FIG. 13 shows example of Cole-Cole plot. Trajectory of impedance of rechargeable battery at various frequencies is shown in FIG. 13. Degree of degradation of battery can be judged based on difference between the trajectory of impedance of subject battery and the trajectory of impedance of healthy battery Internal resistance of battery can be measured by measuring voltage change $\Delta V$ between during discharge and after stopping discharge. See Shizukuni YATA "High performance storage battery—Part 1, Chapter 2, section 2, performance of discharge and charge and evaluation method of safety of battery" pp 207-213, NTS Co., Ltd.

SUMMARY OF THE INVENTION

Problem to be Solved by the Invention

YATA does not disclose diagnostic method for degradation of rechargeable battery.

AC impedance method has following difficulties:

Circuit for applying and measuring AC current is required in addition to circuit for applying charge current. Therefore, circuit becomes complex.

Further, it takes long time to measure the impedance, since frequency of AC should be changed from low frequency to high frequency. Because cycle is long especially at low frequency, measurement time becomes long.

It is object of the present invention to solve the above mentioned problem and to provide a diagnostic device which can measure quickly and has simple circuit.

Means for Solving the Problem

A "program" is a concept that includes a program in source format, a compressed program, and an encrypted program in addition to a program that can directly be executed by a CPU.

DESCRIPTION OF THE PREFERRED EMBODIMENTS

1. Background of the Invention

Inventors have found that voltage change curves of healthy battery and deteriorated battery are different from each other after breaking charge current or discharge current of rechargeable battery. In the deteriorated battery, voltage drop becomes slow quickly after breaking charge current and voltage rising becomes slow quickly after breaking discharge current. The present invention is invented based on this finding.

2. Functional Block Diagram of a Diagnostic Device for Degradation

Figure 1:
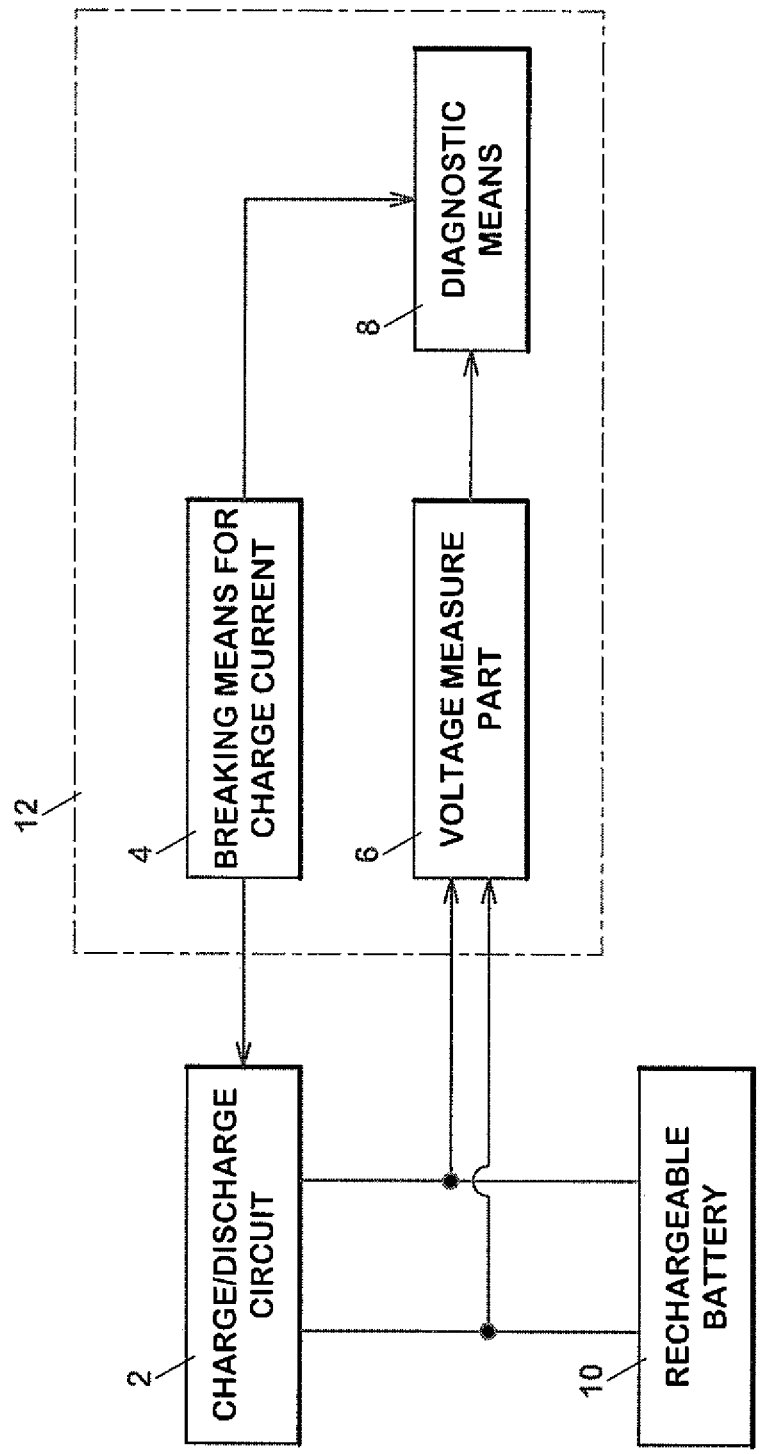
FIG. 1 is a function block diagram of a diagnostic device for degradation according to one embodiment of the present invention.

FIG. 1 is a functional block diagram of a diagnostic device 12 for degradation embodying the present invention. A charge/discharge circuit 2 supplies charge current to a rechargeable battery 10 and discharges the rechargeable battery 10. The charge/discharge circuit 2 also breaks charge current or discharge current of the rechargeable battery 10 in charging or discharging. A voltage measurement part 6 measures terminal voltage of the rechargeable battery 10 after breaking the charge or discharge current. Diagnostic means 8 judges whether the rechargeable battery 10 is deteriorated or not based on the measured voltages.

Voltage change of deteriorated rechargeable battery 10 after breaking the charge or discharge current is more rapid than that of healthy rechargeable battery 10. The diagnostic means 8 can judge whether the rechargeable battery 10 is deteriorated or not based on such voltage change.

3. Hardware Configuration

Figure 2:
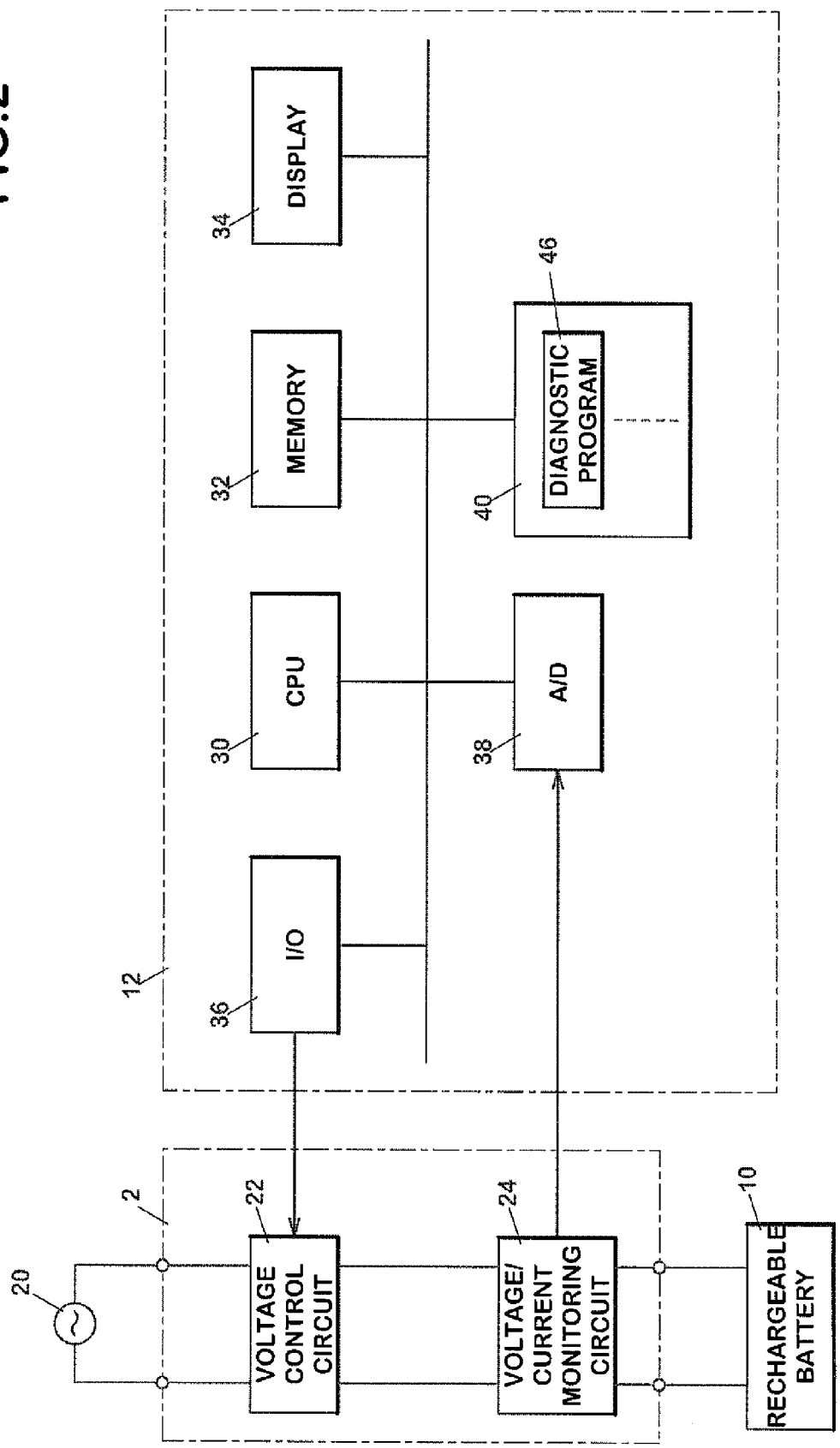
FIG. 2 shows hardware configuration of a diagnostic device for degradation according to one embodiment of the present invention.
Figure 3:
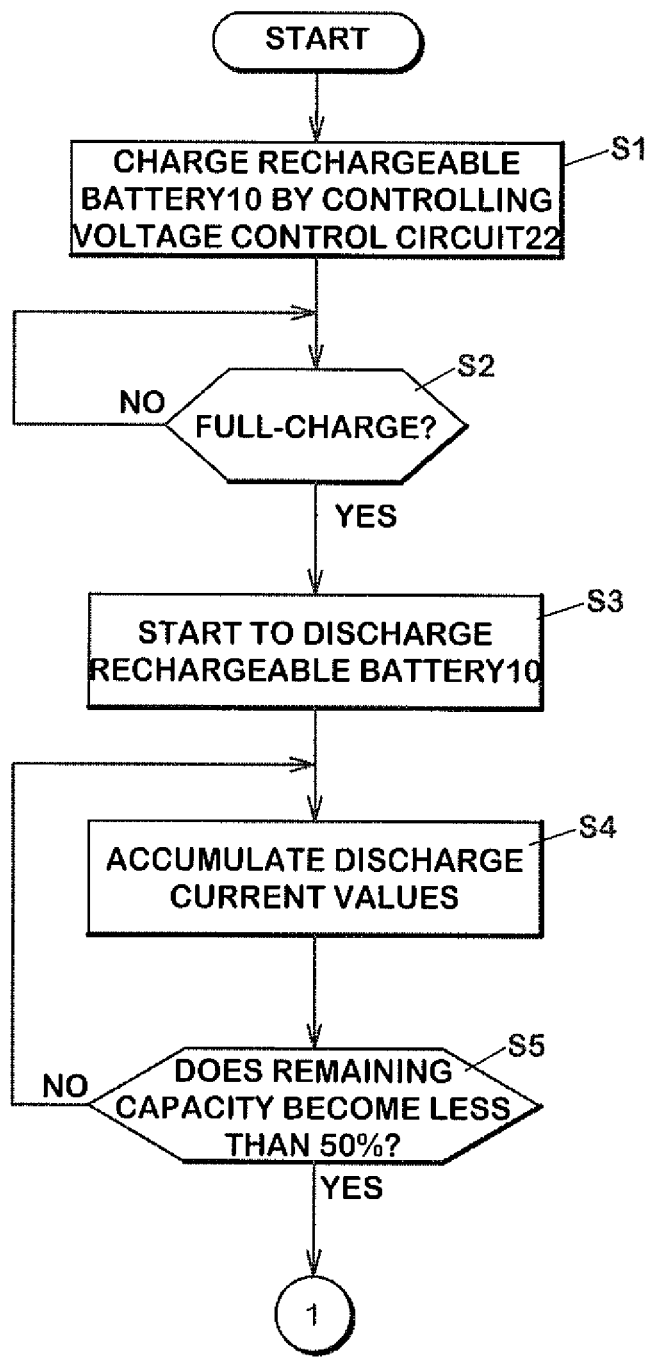
FIG. 3 shows a flowchart of diagnostic program 46.
Figure 4:
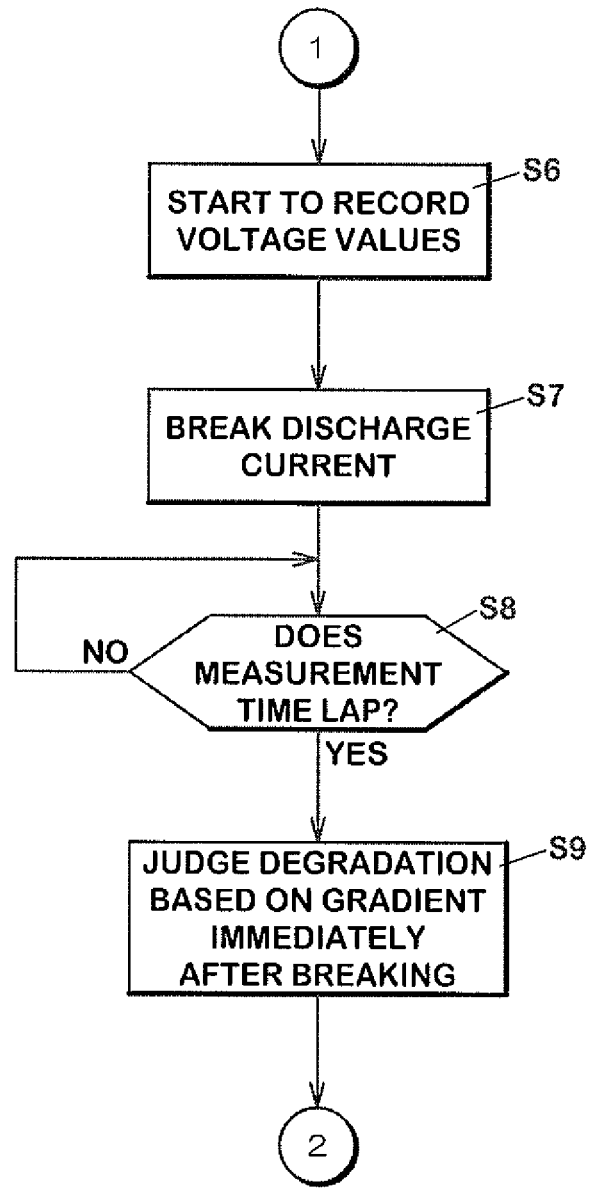
FIG. 4 shows a flowchart of diagnostic program 46.
Figure 5:
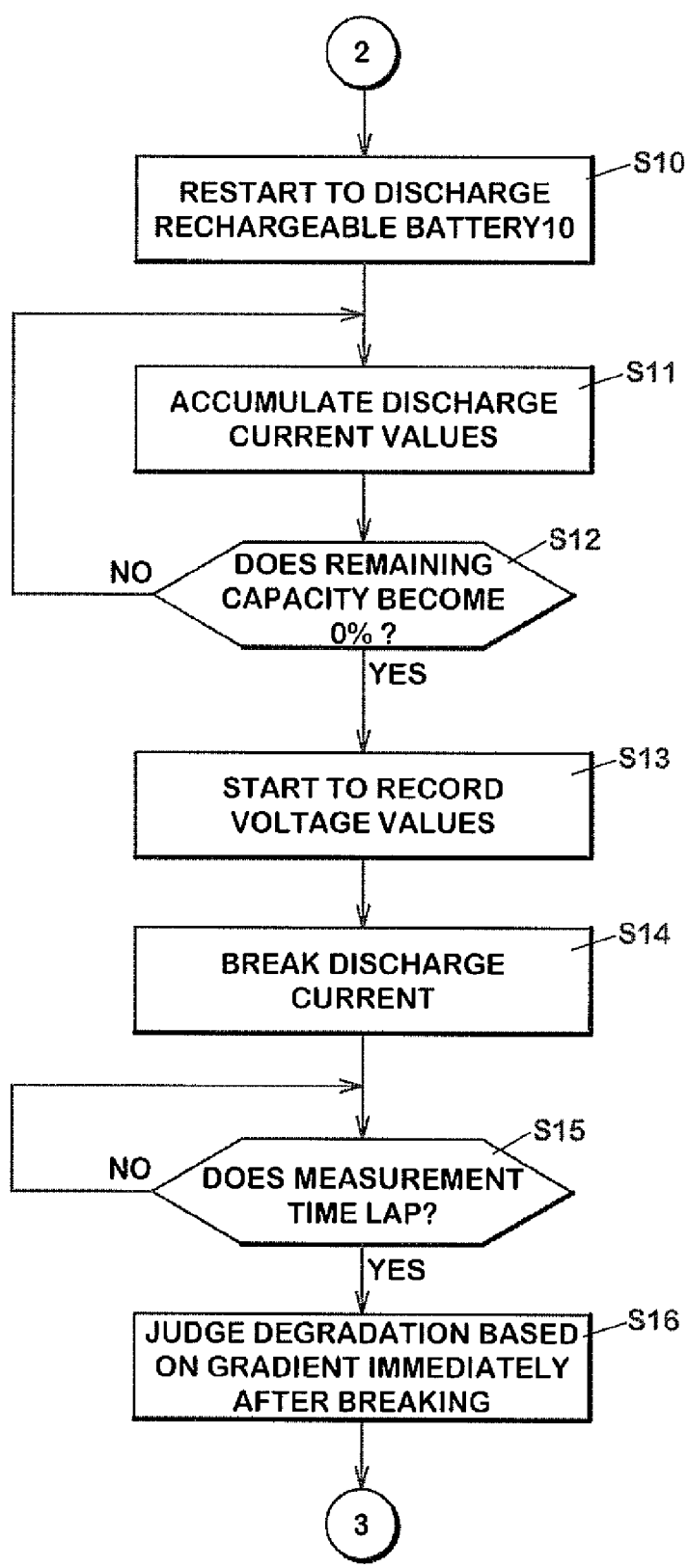
FIG. 5 shows a flowchart of diagnostic program 46.
Figure 6:
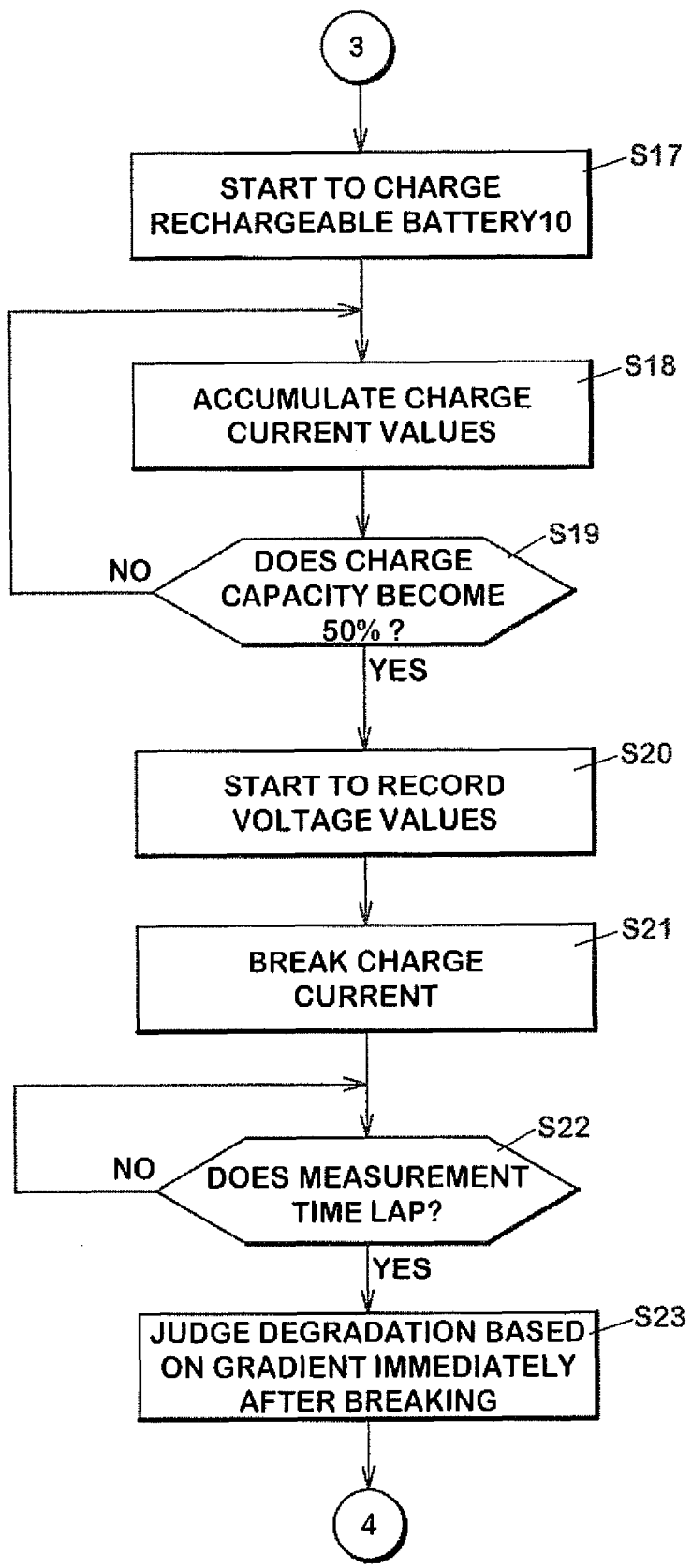
FIG. 6 shows a flowchart of diagnostic program 46.
Figure 7:
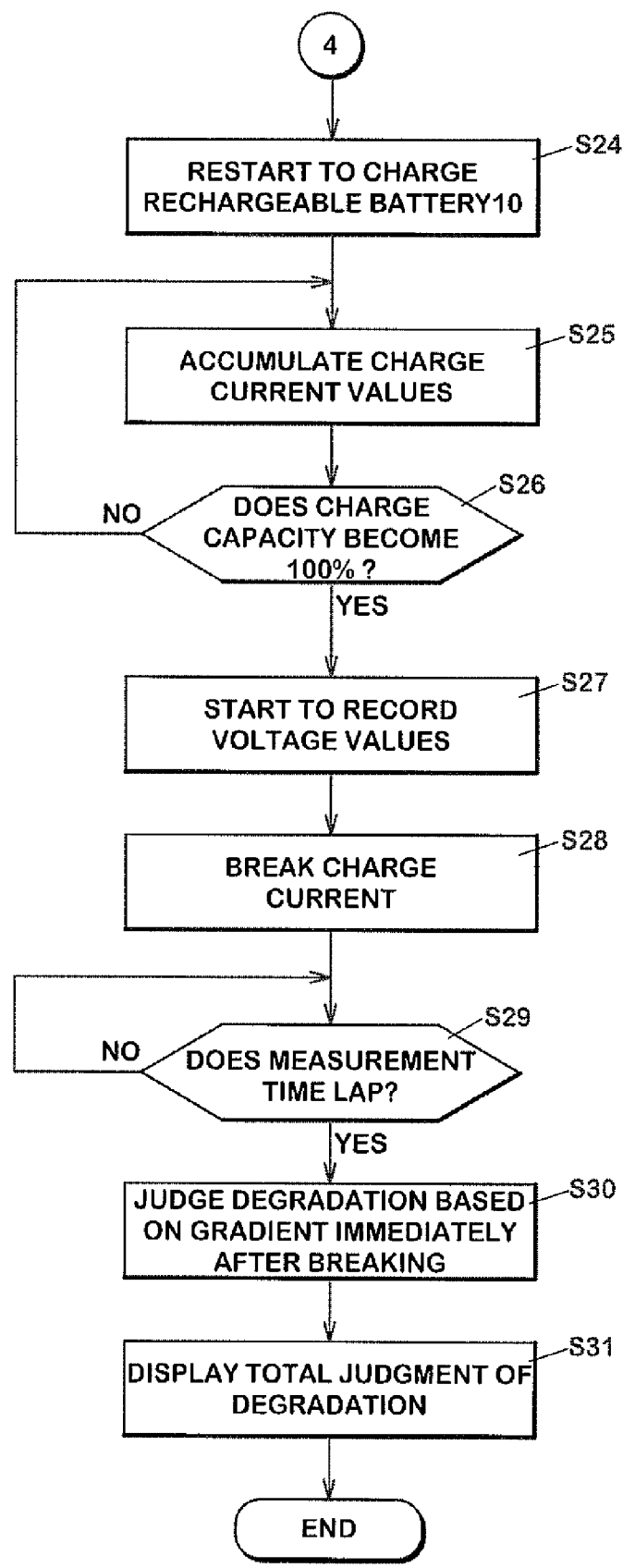
FIG. 7 shows a flowchart of diagnostic program 46.

FIG. 2 shows hardware configuration of the diagnostic device 12 for degradation embodying the present invention. Charge/discharge circuit 2 drops, rectifies and smooth the received commercial power 20 and applies the charge current onto the rechargeable battery 10 (for example rechargeable Li-ion battery). Charge/discharge circuit 2 also breaks the charge current in charging operation or discharge current in discharging operation.

A CPU 30 is connected to a memory 32, display 34, I/O interface 36, A/D converter 38 and storing part 40.

I/O interface 36 is connected to a voltage control circuit 22. The CPU 30 controls the voltage control circuit 22 through the I/O interface 36.

A voltage/current monitoring circuit 24 measures terminal voltage of the rechargeable battery 10 and charge current (or discharge current). Measured output of the voltage/current monitoring circuit 24 is converted into digital data by the A/D converter 38. CPU 30 obtains the data of terminal voltage of the rechargeable battery 10. The storing part stores a diagnostic program 46.

4. Diagnostic Program

FIGS. 3 to 7 show flowchart of the diagnostic program 46. The charge/discharge circuit 2 is connected to the rechargeable battery 10. Provided that present charging status of the rechargeable battery is unknown.

At step S1, CPU 30 starts to charge the rechargeable battery 10 by controlling the voltage control circuit 22. Then, CPU 30 retrieves the output of the voltage/current monitoring circuit 24 through the A/D converter 38 in order to monitor the terminal voltage of the rechargeable battery 10. CPU 30 judges whether the rechargeable battery becomes full charge by monitoring the terminal voltage of the rechargeable battery (step S2). CPU 30 controls the voltage control circuit 22 to start the discharge of the rechargeable battery 10 when the terminal voltage of the rechargeable battery 10 arrives at a predetermined value (the rechargeable battery 10 becomes full charge) (step S3).

CPU 30 retrieves discharge current data from the A/D converter 38 which is converted from analog discharge current measured by the voltage/current monitoring circuit 24. CPU 30 calculates time-accumulated discharge current data (step S4). In other words, CPU 30 multiplies the discharge current value to the discharge time in order to obtain the discharged capacity. Then, CPU 30 subtracts the discharged capacity from the full charge capacity to calculate a remaining capacity of the rechargeable battery 10.

CPU 30 judges whether the remaining capacity decreases less than 50% of full charge capacity (step S5). For example, CPU 30 judges whether the remaining capacity decreases less than 500 mAH in case of the rechargeable battery in which the full charge capacity is 1000 mAH.

When the remaining capacity does not decrease less than 50% of full charge capacity, CPU 30 continues to discharge. When the remaining capacity decreases less than 50% of full charge capacity, CPU 30 starts to record voltage data obtained from the voltage/current monitoring circuit 24 and the A/D converter 38, into the storing part 40 (step S6).

Then CPU 30 controls the voltage control circuit 22 to break the discharge current of the rechargeable battery 10 (step S7). In other words, CPU 30 makes the terminals of rechargeable battery 10 open state. CPU 30 judges whether predetermined measurement time (4 $sec^{1/2}$ for example) laps after breaking the discharge current (step S8). When the predetermined measurement time laps, CPU 30 judges whether the rechargeable battery 10 is degraded based on gradient of the recorded voltage values immediately after breaking the discharge current (step S9).

Figure 8:
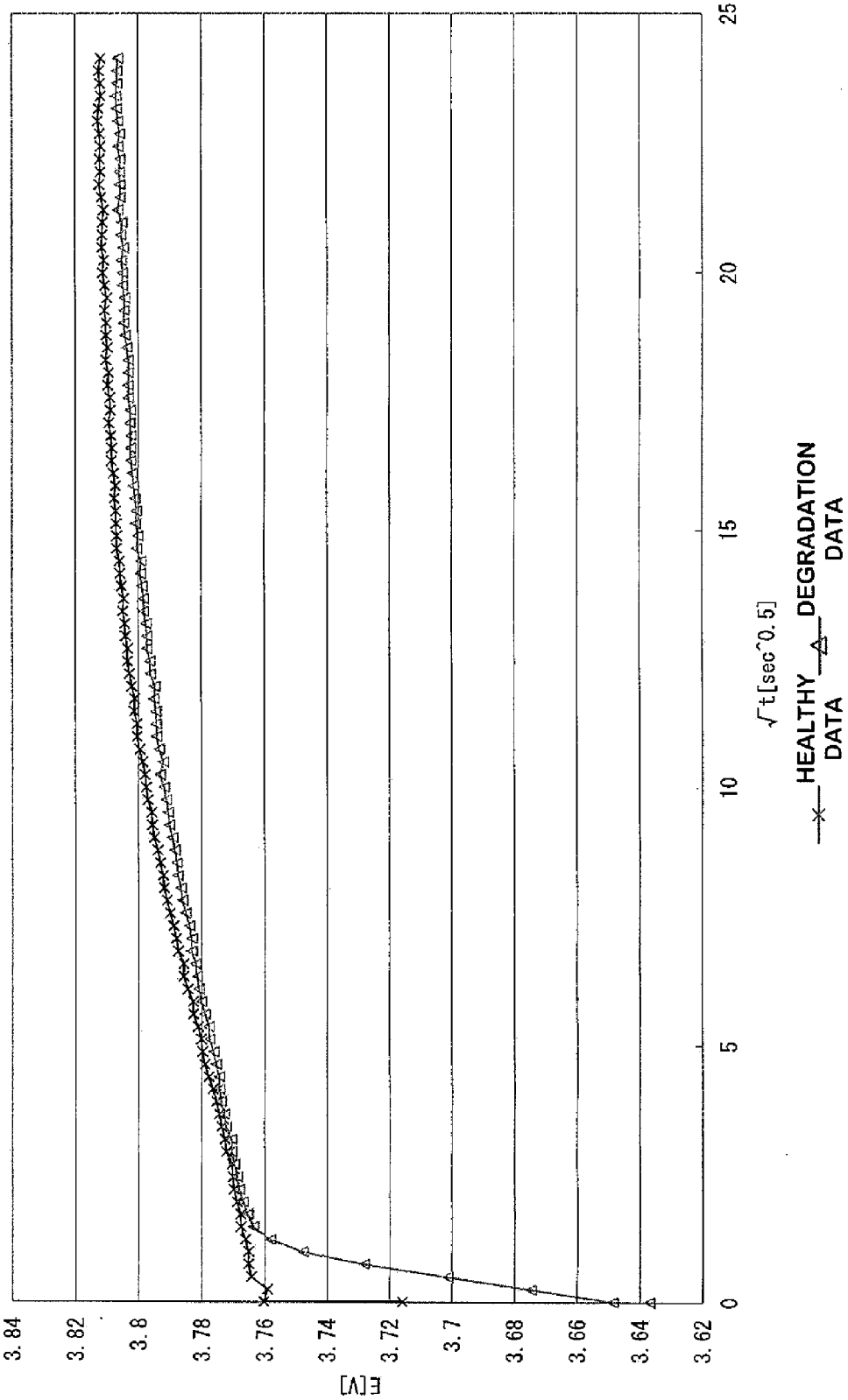
FIG. 8 is a graph for showing voltage change after breaking discharge current.

FIG. 8 shows an example of voltage change immediately after breaking the discharge current. Vertical axis represents voltage and horizontal axis represents time (square root of time). Healthy data represents voltage change of the healthy rechargeable battery. Degradation data represents voltage change of the degraded rechargeable battery.

The healthy data shows 3.72 V and the degradation data shows 3.64 V immediately after breaking the discharge current. While the healthy data extremely rapidly reaches 3.76 V, the degradation data reaches 3.76 V after 1.5 $sec^{1/2}$ from the breaking. The voltage rise of the degraded rechargeable battery is more gradual (slower) than that of the healthy rechargeable battery immediately after breaking.

Therefore, CPU 30 can judge degradation of the rechargeable battery based on whether time required for rising value of voltage to reach predetermined value (0.1 V for example) is greater than predetermined value (1 $sec^{1/2}$ for example). These criteria can be preliminarily calculated and recorded based on measurement results of healthy rechargeable battery and the degraded rechargeable battery.

Then, CPU 30 controls the voltage control circuit 22 to restart the discharge of the rechargeable battery 10 (step S10). Then, CPU 30 retrieves discharge current data from the A/D converter 38 which is converted from analog discharge current measured by the voltage/current monitoring circuit 24. CPU 30 calculates time-accumulated discharge current data (step S11). In other words, CPU 30 multiplies the discharge current value to the discharge time in order to obtain the discharged capacity. Then, CPU 30 subtracts the discharged capacity from the full charge capacity to calculate a remaining capacity of the rechargeable battery 10.

CPU 30 judges whether the remaining capacity decreases to 0% of full charge capacity (step S12). For example, CPU 30 judges whether the remaining capacity decreases to 0 mAH in case of the rechargeable battery in which the full charge capacity is 1000 mAH.

When the remaining capacity does not decrease to 0% of full charge capacity, CPU 30 continues to discharge. When the remaining capacity decreases to 0% of full charge capacity, CPU 30 starts to record voltage data obtained from the voltage/current monitoring circuit 24 and the A/D converter 38, into the storing part 40 (step S13).

Then CPU 30 controls the voltage control circuit 22 to break the discharge current of the rechargeable battery 10 (step S14). CPU 30 judges whether predetermined measurement time (4 $sec^{1/2}$ for example) laps after breaking the discharge current (step S15). When the predetermined measurement time laps, CPU 30 judges whether the rechargeable battery 10 is degraded based on gradient of the recorded voltage values immediately after breaking the discharge current (step S16).

Figure 9:
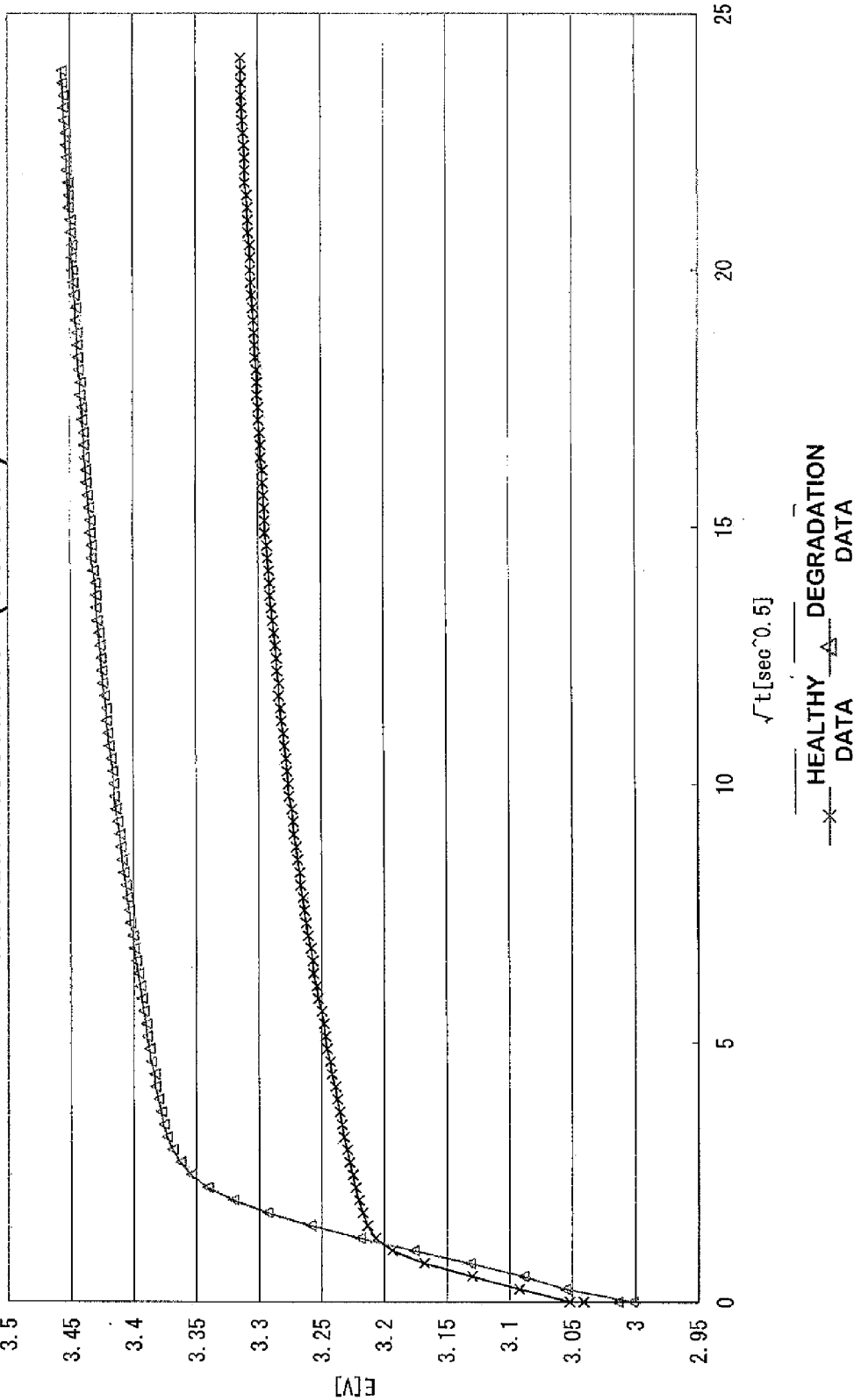
FIG. 9 is a graph for showing voltage change after breaking discharge current.

FIG. 9 shows an example of voltage change immediately after breaking the discharge current. The healthy data shows 3.05 V and the degradation data shows 3.0 V immediately after breaking the discharge current. While the healthy data reaches 3.2 V after 1 $sec^{1/2}$ and then rise slowly, the degradation data reaches 3.35 V after 2.5 $sec^{1/2}$ and then rise slowly. Time required for the voltage raise to become slow at the degraded rechargeable battery 10 is longer than that at the healthy rechargeable battery.

Therefore, CPU 30 can judge degradation of the rechargeable battery based on whether time required for the voltage raise gradient to become less than predetermined value (0.05 $V/sec^{1/2}$ for example) is greater than predetermined time (1.5 $sec^{1/2}$ for example).

Then CPU 30 controls the voltage control circuit 22 to start to charge the rechargeable battery 10 (step S17). CPU 30 retrieves charge current data from the A/D converter 38 which is converted from analog charge current measured by the voltage/current monitoring circuit 24. CPU 30 calculates time-accumulated charge current data (step S18). In other words, CPU 30 multiplies the charge current value to the charge time in order to obtain the charged capacity.

CPU 30 judges whether the charged capacity reaches 50% of full charge capacity (step S19). For example, CPU 30 judges whether the charged capacity reaches 500 mAH in case of the rechargeable battery in which the full charge capacity is 1000 mAH.

When the charge capacity does not reach 50% of full charge capacity, CPU 30 continues to charge. When the charge capacity reaches 50% of full charge capacity, CPU 30 starts to record voltage data obtained from the voltage/current monitoring circuit 24 and the A/D converter 38, into the storing part 40 (step S20).

Then CPU 30 controls the voltage control circuit 22 to break the charge current of the rechargeable battery 10 (step S21). In other words, CPU 30 makes the terminals of rechargeable battery 10 open state. CPU 30 judges whether predetermined measurement time (4 $\sec^{1/2}$ for example) laps after breaking the charge current (step S8). When the predetermined measurement time laps, CPU 30 judges whether the rechargeable battery 10 is degraded based on gradient of the recorded voltage values immediately after breaking the charge current (step S23).

Figure 10:
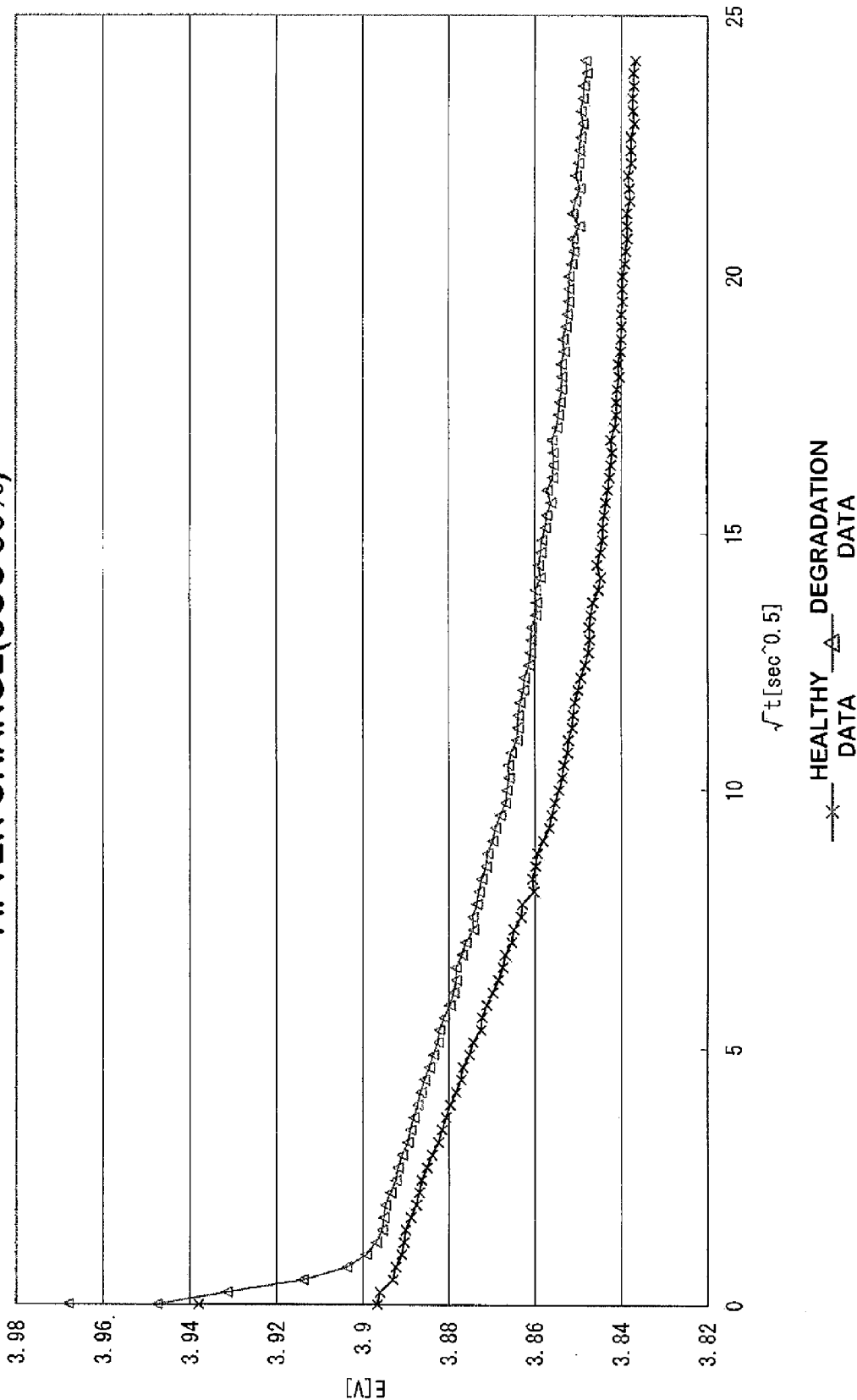
FIG. 10 is a graph for showing voltage change after breaking charge current.

FIG. 10 shows an example of voltage change immediately after breaking the charge current. The healthy data shows 3.94 V and the degradation data shows 3.95 V immediately after breaking the discharge current. The healthy data drops to 3.9 V simultaneously with the breaking as shown in FIG. 10. On the contrary, the degradation data drops to 3.9 V after about 1 $\sec^{1/2}$ from the breaking. The voltage drop of the degraded rechargeable battery is more gradual (slower) than that of the healthy rechargeable battery immediately after breaking.

Therefore, CPU 30 can judge degradation of the rechargeable battery based on whether time required for dropping value of voltage to reach predetermined value (0.1 V for example) is greater than predetermined value (1 $\sec^{1/2}$ for example). These criteria can be preliminarily calculated and recorded based on measurement results of healthy rechargeable battery and the degraded rechargeable battery.

Then, CPU 30 controls the voltage control circuit 22 to restart the charge of the rechargeable battery 10 (step S24). Then, CPU 30 retrieves discharge current data from the A/D converter 38 which is converted from analog charge current measured by the voltage/current monitoring circuit 24. CPU 30 calculates time-accumulated charge current data (step S25). In other words, CPU 30 multiplies the charge current value to the charge time in order to obtain the charged capacity.

CPU 30 judges whether the charged capacity reaches 100% of full charge capacity (step S26). For example, CPU 30 judges whether the charged capacity reaches to 1000 mAH in case of the rechargeable battery in which the full charge capacity is 1000 mAH.

When the charge capacity does not reach 1000 mA, CPU 30 continues to charge. When the charge capacity reaches 1000 mA, CPU 30 starts to record voltage data obtained from the voltage/current monitoring circuit 24 and the A/D converter 38, into the storing part 40 (step S27).

Then CPU 30 controls the voltage control circuit 22 to break the charge current of the rechargeable battery 10 (step S28). CPU 30 judges whether predetermined measurement time (4 $\sec^{1/2}$ for example) laps after breaking the charge current (step S29). When the predetermined measurement time laps, CPU 30 judges whether the rechargeable battery 10 is degraded based on gradient of the recorded voltage values immediately after breaking the charge current (step S30).

Figure 11:
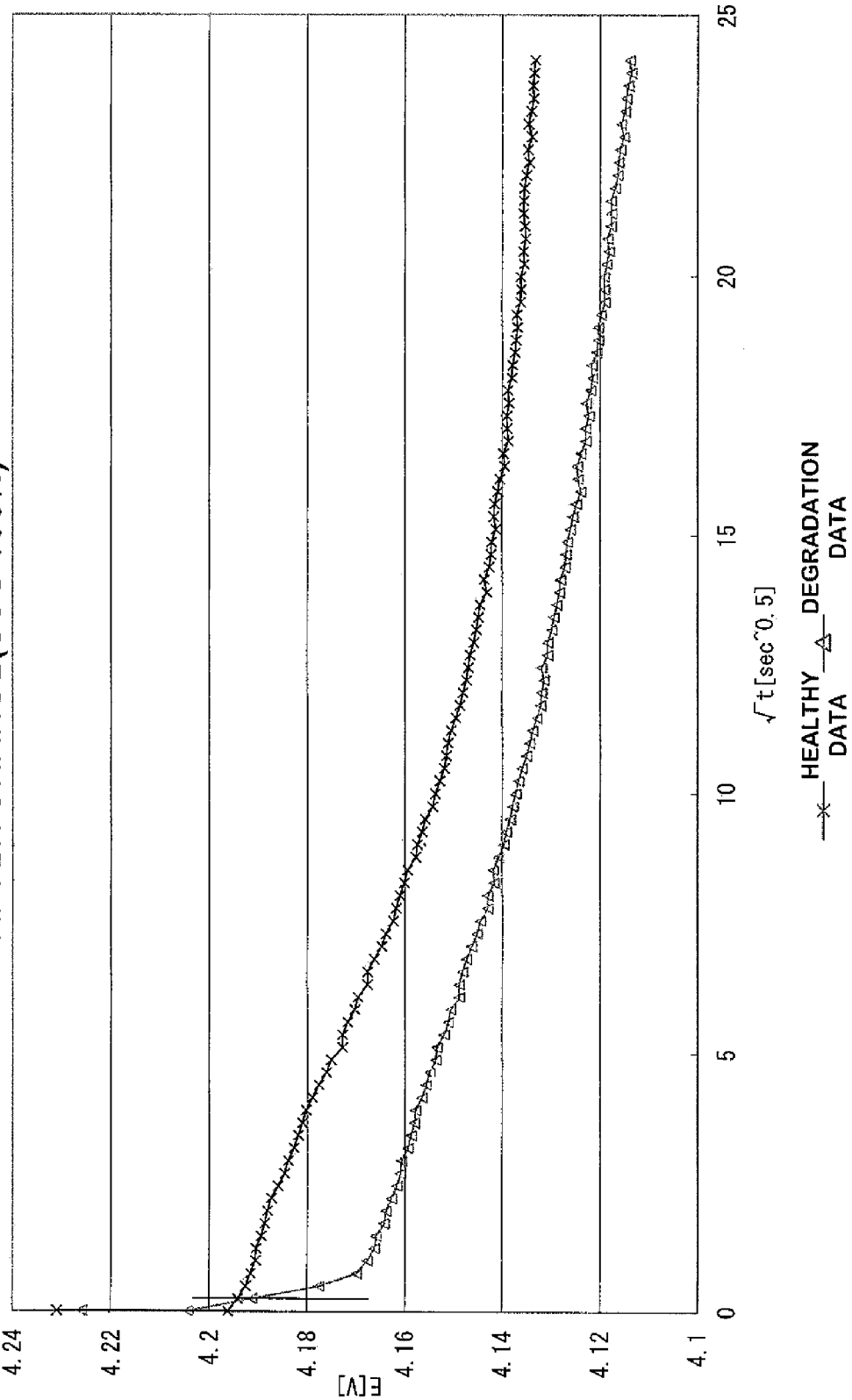
FIG. 11 is a graph for showing voltage change after breaking charge current.

FIG. 11 shows an example of voltage change immediately after breaking the charge current. Both the healthy data and the degradation data show approximate 4.23 V after breaking the charge current. While the healthy data drops to 4.2 V immediately after breaking the charge current, the degradation data drops to 4.17 V after 1 $\sec^{1/2}$. The voltage drop of the degraded rechargeable battery immediately after breaking the charge current is slower than that of the healthy rechargeable battery.

Therefore, CPU 30 can judge degradation of the rechargeable battery based on whether time required for voltage drop to reach predetermined value (0.05 V for example) is greater than predetermined value (1 $\sec^{1/2}$ for example). CPU 30 may also judge degradation of the rechargeable battery based on the time required for the voltage drop to become slow (similar to after 50% discharge).

CPU 30 judges degradation of the rechargeable battery 10 based on total judgment of steps S9, S16, S23 and S30 (step S31). For example, CPU 30 judges that the rechargeable battery is degraded when at least one of judgments of steps S9, S16, S23 and S30 show the degradation of the rechargeable battery 10. CPU 30 displays the judgment result on the display 34 etc. (step S31). For example, CPU 30 displays "healthy", "degraded" etc.

As shown in FIGS. 8 to 11, voltages of the healthy rechargeable battery and the degraded rechargeable battery are not much different when the voltage becomes stable after ending drastic change of the voltage immediately after breaking. Therefore, it is difficult to judge the degradation of the rechargeable battery based on such difference of the voltages. In this embodiment, the degradation of the rechargeable battery can be correctly judged, since the judgment is made based on the voltage change immediately after breaking.

Figure 12:
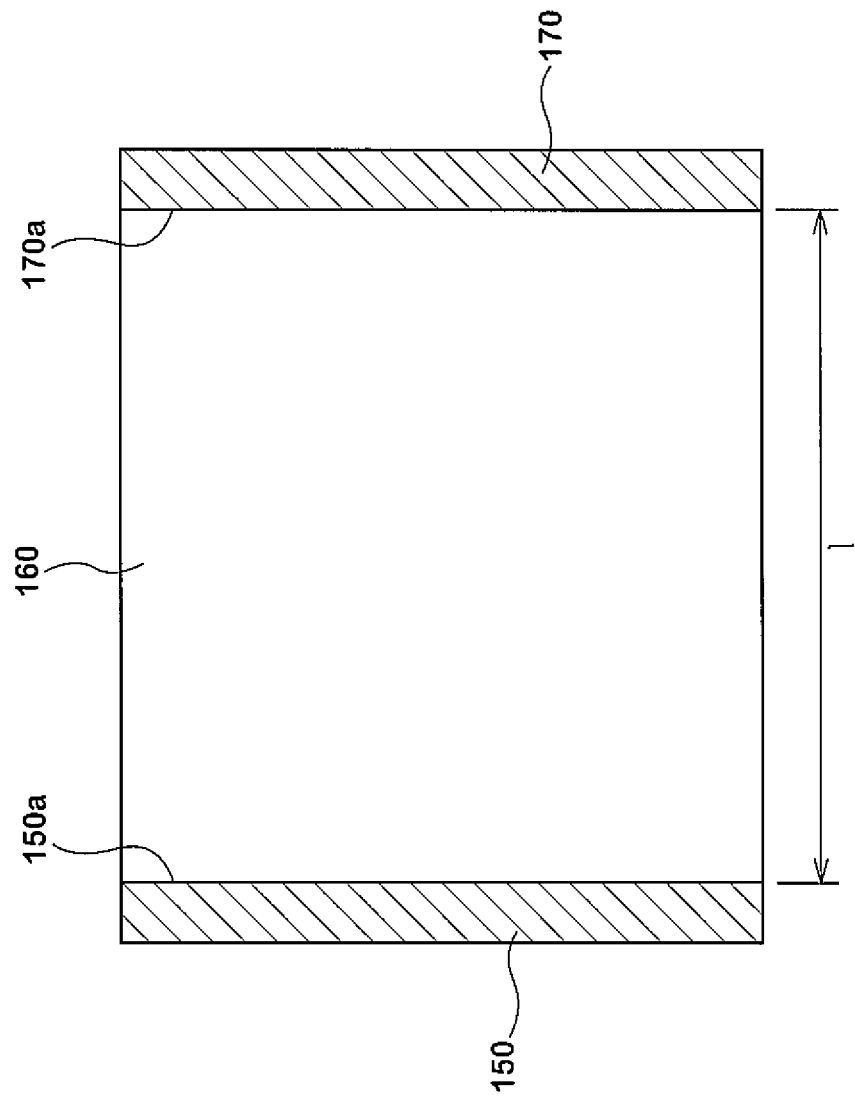
FIG. 12 shows structure of rechargeable battery.
Figure 13:
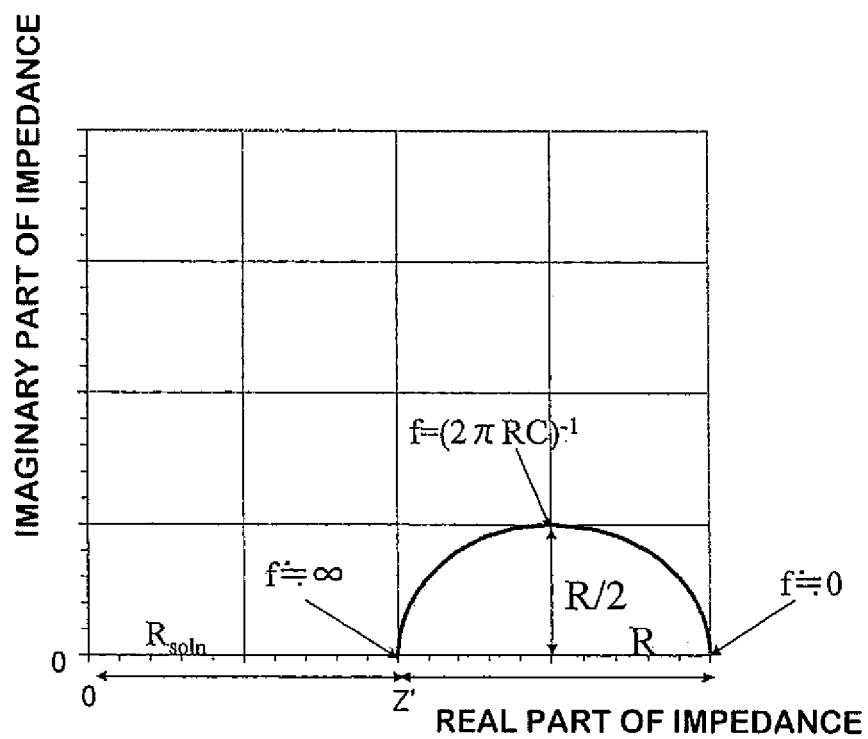
FIG. 13 is a diagram for showing diagnostic method for degradation based on impedance measurement.

Inventors have found that temporal variation of the voltage of electrode after breaking the charge current or the discharge current can be calculated following equation:

$$E = E_0 + \Delta E_0 \sqrt{\frac{4D_s}{\pi l^2}} \sqrt{t}$$

where E represents voltage of surface 150a of electrode 150 or 170a of electrode 170 in FIG. 12. E0 represents initial voltage. ΔE0 represents difference between the initial voltage and final attained voltage after breaking. "I" represents thickness of separator 160 in FIG. 12. Ds represents coefficient of diffusion of lithium ion. T represents laps time after breaking the current.

When above mentioned parameters of the healthy rechargeable battery are known, the changes as shown in FIGS. 8 to 11 can be calculated without actual measurement. Therefore, the degradation of the rechargeable battery can be judged without measuring the healthy rechargeable battery.

5. Other Embodiments (1) In the above embodiment, the current is broken at four points SOC 50% discharge, SOC 0% discharge, SOC 50% charge and SOC 100% charge and the degradation of the rechargeable battery is judged based on the voltage changes at these points. However, the degradation of the rechargeable battery can be judged based on the voltage change of any of one point (or two points or three points).

Further, the judge may be made based on the voltage change after breaking at SOC 10%, 30%, 70% etc, of discharge or charge.

(2) In the above embodiment, judgment is made using the charge/discharge circuit 2. However, providing only the charge circuit is enough instead of the charge/discharge circuit 2 in case where only the judgment after breaking the charge is made. Further, providing only the discharge circuit is enough instead of the charge/discharge circuit 2 in case where only the judgment after breaking the discharge is made.

(3) In the above embodiment, diagnostic device for degradation embodying the present invention is disclosed. The diagnostic device may be incorporated into charging device for the rechargeable battery. The degradation may be judged by temporarily breaking the charge current while the rechargeable battery is charged by the charging device. The judgment can be made simultaneously in the charging operation.

(4) In the above embodiment, the degradation is judged. Degree of degradation may be judged according to time required for predetermined voltage change being made (that is gradient of voltage change). If the time is longer, more degradation is processed.

(5) The judgment of degradation or degree of degradation may be informed to the charge device. The charge device can control the charging time which is required to be desired charge (full-charge for example) upon receiving such information.

What is claimed is:

1. A diagnostic device that judges degradation of a rechargeable battery comprising:
   means for breaking charge current of the rechargeable battery to change the terminals of the rechargeable battery to an open state, the rechargeable battery in a charging state connected to a charge circuit during charging of the rechargeable battery, or means for breaking discharge current of the rechargeable battery to change the terminals of the rechargeable battery to an open state, the rechargeable battery connected to a discharge circuit during discharging of the rechargeable battery;
   a voltage measurement part which measures terminal voltage of the rechargeable battery for which charge current or discharge current is broken by the breaking means;
   means for diagnosing degradation of the rechargeable battery based on the temporal change of terminal voltage measured by the voltage measurement part; and
   a display connected to the diagnosing means that displays a judgement result,
   wherein said diagnostic means judges whether the rechargeable battery is degraded or not based on a comparison of measured falling or rising speed of the terminal voltage of the rechargeable battery to be diagnosed immediately after the breaking and calculated falling or rising speed of the terminal voltage of a healthy rechargeable battery immediately after the breaking,
   wherein said calculated falling or rising speed is calculated based on a thickness of a separator and a coefficient of ion diffusion of the healthy rechargeable battery.

2. The diagnostic device according to claim 1, wherein said diagnostic means judges whether the rechargeable battery is degraded or not based on falling speed or rising speed of the terminal voltage immediately after the breaking.

3. A diagnostic device that judges degradation of a rechargeable battery comprising:
   means for breaking charge current of the rechargeable battery to change the terminals of the rechargeable battery to an open state, the rechargeable battery in a charging state connected to a charge circuit during charging of the rechargeable battery, or means for breaking discharge current of the rechargeable battery to change the terminals of the rechargeable battery to an open state, the rechargeable battery connected to a discharge circuit during discharging of the rechargeable battery;
   a voltage measurement part which measures terminal voltage of the rechargeable battery for which charge current or discharge current is broken by the breaking means;
   means for diagnosing degradation of the rechargeable battery based on a temporal change of terminal voltage measured by the voltage measurement part; and
   a display connected to the diagnosing means that displays a judgement result,
   wherein said diagnostic means judges whether the rechargeable battery is degraded or not based on a time required for a gradient of the voltage drop immediately after the breaking to become predetermined smooth.

4. The diagnostic device according to claim 3, wherein said diagnostic means judges whether the rechargeable battery is degraded or not based on a comparison of measured time required for gradient of the voltage drop of the rechargeable battery to be diagnosed immediately after the breaking to become predetermined smooth and calculated time required for gradient of the voltage drop of healthy rechargeable battery immediately after the breaking to become predetermined smooth,
   wherein said calculated time required for a gradient of the voltage drop of the healthy rechargeable battery to become predetermined smooth is calculated based on thickness of a separator and a coefficient of ion diffusion of the healthy rechargeable battery.

5. A charge device for a rechargeable battery comprising:
   a charge circuit which supplies charge current to the rechargeable battery;
   means for breaking charge current of the rechargeable battery to change the terminals of the rechargeable battery to an open state, the rechargeable battery in a charging state connected to a charge circuit during charging of the rechargeable battery, or means for breaking discharge current of the rechargeable battery to change the terminals of the rechargeable battery to an open state, the rechargeable battery connected to a discharge circuit during discharging of the rechargeable battery;
   a voltage measurement part which measures terminal voltage of the rechargeable battery in which charge current or discharge current is broken by the breaking means;
   means for diagnosing degradation of the rechargeable battery based on the temporal change of terminal voltage measured by the voltage measurement part; and
   a display connected to the diagnosing means that displays a judgement result, wherein said diagnostic means judges whether the rechargeable battery is degraded or not based on a comparison of measured falling or rising speed of the terminal voltage of rechargeable battery to be diagnosed immediately after the breaking and calculated falling or rising speed of the terminal voltage of a healthy rechargeable battery immediately after the breaking, wherein said calculated falling or rising speed is calculated based on a thickness of a separator and a coefficient of ion diffusion of the healthy rechargeable battery.

6. The charge device according to claim 5, wherein said diagnostic means judges whether the rechargeable battery is degraded or not based on falling speed or rising speed of the terminal voltage immediately after the breaking.

7. A charge device for a rechargeable battery comprising:

a charge circuit which supplies charge current to the rechargeable batter;

means for breaking charge current of the rechargeable battery to change the terminals of the rechargeable battery to an open state, the rechargeable battery in a charging state connected to a charge circuit during charging of the rechargeable battery, or means for breaking discharge current of the rechargeable battery to change the terminals of the rechargeable battery to an open state, the rechargeable battery connected to a discharge circuit during discharging of the rechargeable battery;

a voltage measurement part which measures terminal voltage of the rechargeable battery in which charge current or discharge current is broken by the breaking means;

means for diagnosing degradation of the rechargeable battery based on a temporal change of terminal voltage measured by the voltage measurement part; and a display connected to the diagnosing means that displays a judgement result, wherein said diagnostic means judges whether the rechargeable battery is degraded or not based on time required for gradient of the voltage drop immediately after the breaking to become predetermined smooth.

8. The charge device according to claim 7, wherein said diagnostic means judges whether the rechargeable battery is degraded or not based on comparison of measured time required for gradient of the voltage drop of rechargeable battery to be diagnosed immediately after the breaking to become predetermined smooth and calculated time required for gradient of the voltage drop of healthy rechargeable battery immediately after the breaking to become predetermined smooth, wherein said calculated time required for gradient of the voltage drop of the healthy rechargeable battery to become predetermined smooth is calculated based on thickness of a separator and coefficient of ion diffusion of the healthy rechargeable battery.

9. A diagnostic method for judging degradation of a rechargeable battery, the method comprising the steps:

breaking charge current of the rechargeable battery to change the terminals of the rechargeable battery to an open state, the rechargeable battery in a charging state connected to a charge circuit during charging of the rechargeable battery, or breaking discharge current of the rechargeable battery to change the terminals of the rechargeable battery to an open state, the rechargeable battery connected to a discharge circuit during discharging of the rechargeable battery;

measuring terminal voltage of the rechargeable battery for which charge current or discharge current is broken;

diagnosing degradation of the rechargeable battery based on the temporal change of terminal voltage measured by the voltage measurement part; and displaying a judgement result on a display, wherein in said diagnostic step it is judged whether the rechargeable battery is degraded or not based on a comparison of measured falling or rising speed of the terminal voltage of the rechargeable battery to be diagnosed immediately after the breaking and calculated falling or rising speed of the terminal voltage of a healthy rechargeable battery immediately after the breaking, wherein said calculated falling or rising speed is calculated based on a thickness of a separator and a coefficient of ion diffusion of the healthy rechargeable battery.

10. A diagnostic method for judging degradation of a rechargeable battery, the method comprising:

breaking charge current of the rechargeable battery to change the terminals of the rechargeable battery to an open state, the rechargeable battery in a charging state connected to a charge circuit during charging of the rechargeable battery, or breaking discharge current of the rechargeable battery to change the terminals of the rechargeable battery to an open state, the rechargeable battery connected to a discharge circuit during discharging of the rechargeable battery;

measuring terminal voltage of the rechargeable battery for which charge current or discharge current is broken by the breaking means;

diagnosing degradation of the rechargeable battery based on the temporal change of a terminal voltage measured by the voltage measurement part; and displaying a judgement result on a display, wherein in said diagnostic step it is judged whether the rechargeable battery is degraded or not based on a time required for a gradient of the voltage drop immediately after the breaking to become predetermined smooth.

* * * * *